United States Patent [19]
Hiraga

[11] Patent Number: 5,977,573
[45] Date of Patent: Nov. 2, 1999

[54] WIRING PATTERN FOR A SEMICONDUCTOR INTEGRATED CIRCUIT DEVICE

[75] Inventor: Noriaki Hiraga, Kyoto, Japan

[73] Assignee: Rohm Co., Ltd., Kyoto, Japan

[21] Appl. No.: 09/112,459

[22] Filed: Jul. 9, 1998

[30] Foreign Application Priority Data

Jul. 9, 1997 [JP] Japan ................................ H9-183298

[51] Int. Cl.⁶ .................................................. H01L 27/10
[52] U.S. Cl. ........................ 257/206; 257/207; 257/208; 257/211
[58] Field of Search ................................... 257/204, 206, 257/207, 208, 210, 211

[56] References Cited

U.S. PATENT DOCUMENTS 5,619,048   4/1997   Yokota et al. ........................... 257/207
5,764,533   6/1998   deDood .................................... 364/491

Primary Examiner—Ngân V. Ngô
Attorney, Agent, or Firm—Nikaido Marmelstein Murray & Oram LLP

[57] ABSTRACT

In a C-MOS type output circuit, desired connections between a P-MOS transistor and an N-MOS transistor are achieved without forming a third wiring layer. In a semiconductor integrated circuit device in which a group of P-MOS transistors and a group of N-MOS transistors are formed on a semiconductor substrate, in which the transistors are arranged with their channel length aligned with the direction in which free space is available within the semiconductor chip, and in which the transistors are connected in a predetermined manner with wiring patterns laid on the semiconductor substrate, a power source line and a ground line, each formed as a wiring pattern in a second wiring layer, each have a portion thereof separated from a remaining portion thereof by a circular groove so that an isolated wiring region is formed within each of the power source line and the ground line so as to be connected, by way of a via hole, to wiring patterns that are formed linearly and parallel to one another in a first wiring layer to connect between the group of P-MOS transistors and the group of N-MOS transistors.

4 Claims, 7 Drawing Sheets

WIRING PATTERN FOR A SEMICONDUCTOR INTEGRATED CIRCUIT DEVICE

BACKGROUND OF THE INVENTION

1. Field of the Invention

The present invention relates to a semiconductor integrated circuit device, and particularly to a semiconductor integrated circuit device having a C-MOS (complementary metal-oxide semiconductor) type structure.

2. Description of the Prior Art

FIG. 5 illustrates a conventional semiconductor integrated circuit device 100 having a number of I/O (input/output) cells 90a, 90b, 90c, . . . , 90n formed therein. Each of such I/O cells typically has an output circuit in which a P-MOS transistor and an N-MOS transistor are connected in a C-MOS structure.

In this type of semiconductor integrated circuit device, in particular where very small transistors are formed as in an LSI chip, an increase in driving capacity is achieved by connecting a plurality of such CMOS structures in parallel as shown in FIG. 9. In FIG. 9, P1, P2, . . . , Pn represent P-MOS transistors; N1, N2, . . . , Nn represent N-MOS transistors; $V_{DD}$ represents a power source line; $V_{SS}$ represents a ground line; numeral 91 represents an output terminal.

Conventionally, two types of layout have been known for forming such an output circuit on a semiconductor substrate: the layout shown in FIG. 3 (a first conventional example) and the layout shown in FIG. 4 (a second conventional example). In FIG. 3, which shows the first conventional example, numeral 95 represents a wiring pattern, formed in a first wiring layer, that is connected to the source S1 of the P-MOS transistors by way of a contact hole 74 and connected to the source of the N-MOS transistors by way of a contact hole 84.

Numeral 96 represents another wiring pattern, also formed in the first wiring layer, that is similarly connected to the drain D1 of the P-MOS transistors by way of contact holes 75 and 76 and connected to the drain D1 of the N-MOS transistors by way of contact holes 85 and 86. Numeral 97 represents still another wiring pattern, also formed in the first wiring layer, that is connected to the source S2 of the P-MOS transistors by way of a contact hole 77 and connected to the source S2 of the N-MOS transistors by way of a contact hole 87.

Numeral 72 represents the gate electrode of the first P-MOS transistor, and numeral 73 represents the gate electrode of the second P-MOS transistor. On the other hand, numerals 82 and 83 represent the gate electrodes of the first and second N-MOS transistors, respectively. The power source line $V_{DD}$ and the ground line $V_{SS}$ are both formed as a wiring pattern in a second wiring layer.

In FIG. 4, which shows the second conventional example, the orientation of the transistors is different by 90 degrees as compared with the first conventional example. Numeral 101 represents a wiring pattern, formed in a third wiring layer, that serves to couple the P-MOS transistors with the N-MOS transistors. The power source line $V_{DD}$ and the ground line $V_{SS}$ are both formed as a wiring pattern in a second wiring layer. Numerals 102 to 106 represent wiring patterns formed in a first wiring layer.

When the number of transistors is increased to increase the driving capacity, the dimension WX shown in FIG. 3 that corresponds to the width of a single transistor needs to be multiplied by an integer. Whereas FIG. 3 shows a case where two transistors are formed on each of the P-MOS and N-MOS sides, FIG. 6A shows a case where six transistors are formed, a nd FIG. 6B shows a case where one more transistor is added thereto. Note that, for simplicity's sake, only the transistors on the P-MOS side are shown in FIGS. 6A and 6B. Here, the channel length of the transistors extends in the direction "X", and their channel width extends in the direction "Y".

In FIG. 6A, G1 to G6 represent the gate electrodes of the P-MOS transistors; that is, there are six P-MOS transistors. Here, addition of one more transistor is achieved, as shown in FIG. 6B, by increasing the number of transistors in the lateral direction. G7 represents the gate electrode of the added transistor.

However, as shown in FIG. 5, the size and shape of the I/O cells 90a to 90n are predetermined for each type of semiconductor integrated circuit device 100, and therefore, in most cases, it is simply impossible to increase the dimension XA any further. In such a case, in the first conventional example (FIG. 3), it is inevitable to increase the transistors in the direction "Y", as shown in FIG. 7. This, however, creates wasted space.

On the other hand, in the second conventional example (FIG. 4), where the channel length extends in the direction "Y" and the channel width extends in the direction "X", it is possible to increase the transistors efficiently in the direction "Y", as shown in FIG. 8. However, this second conventional example inconveniently requires a wiring pattern 101 (see FIG. 4) in a third wiring layer to connect the P-MOS side to the N-MOS side.

SUMMARY OF THE INVENTION

An object of the present invention is to provide a novel and useful type of semiconductor integrated circuit device having a structure that allows easy addition of transistors (like the second conventional example) and that nevertheless requires no wiring pattern in a third wiring layer.

To achieve the above object, according to one aspect of the present invention, in a semiconductor integrated circuit device in which a group of transistors of a first conduction type and a group of transistors of a second conduction type are formed on a semiconductor substrate, in which the transistors are arranged with their channel length aligned with the direction in which free space is available within the semiconductor chip, and in which the transistors are connected in a predetermined manner with wiring patterns laid on the semiconductor substrate, a power source line and a ground line, each formed as a wiring pattern in a second wiring layer, each have a portion thereof separated from a remaining portion thereof by a circular groove so that an isolated wiring region is formed within each of the power source line and the ground line so as to be connected, by way of a via hole, to wiring patterns that are formed in a first wiring layer to connect between the group of transistors of the first conduction type and the group of transistors of the second conduction type.

According to another aspect of the present invention, a semiconductor integrated circuit device is provided with: a plurality of P-MOS transistors formed in a semiconductor substrate; a plurality of N-MOS transistors formed in the semiconductor substrate; a first insulating film laid on the semiconductor substrate; a plurality of gate electrodes, one for each of the transistors, that are arranged in a first direction on the first insulating film; a second insulating film laid on the first insulating film on which the gate electrodes are arranged; first wiring patterns laid on the second insulating film for connecting together the sources of the plurality of P-MOS transistors; second wiring patterns laid on the second insulating film for connecting together the sources of the plurality of N-MOS transistors; third wiring patterns laid linearly and parallel to one another on the second insulating film for connecting the drains of the P-MOS transistors to the drains of the N-MOS transistors; a third insulating film formed on the second insulating film on which the first, second, and third wiring patterns are laid; a power source line formed on the third insulating film over the P-MOS transistors; a ground line formed on the third insulating film over the N-MOS transistors; a first isolated wiring pattern formed within the power source line; a second isolated wiring pattern formed within the ground line; and means for connecting the first and second isolated wiring patterns to the third wiring patterns by way of a via hole formed in the third insulating film.

In this structure, an isolated wiring region is formed within each of the power source line and the ground line, which are each formed in the second wiring layer, and those isolated wiring regions are connected to predetermined wiring patterns formed in the first wiring layer (the wiring patterns connecting between the transistors of the first conduction type and the transistors of the second conduction type) by way of via holes formed in the insulating film between the first and second wiring layers. This makes it possible to achieve the desired connections a s in the second conventional example without forming wiring patterns in a third wiring layer, and thus helps simplify the wiring structure.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
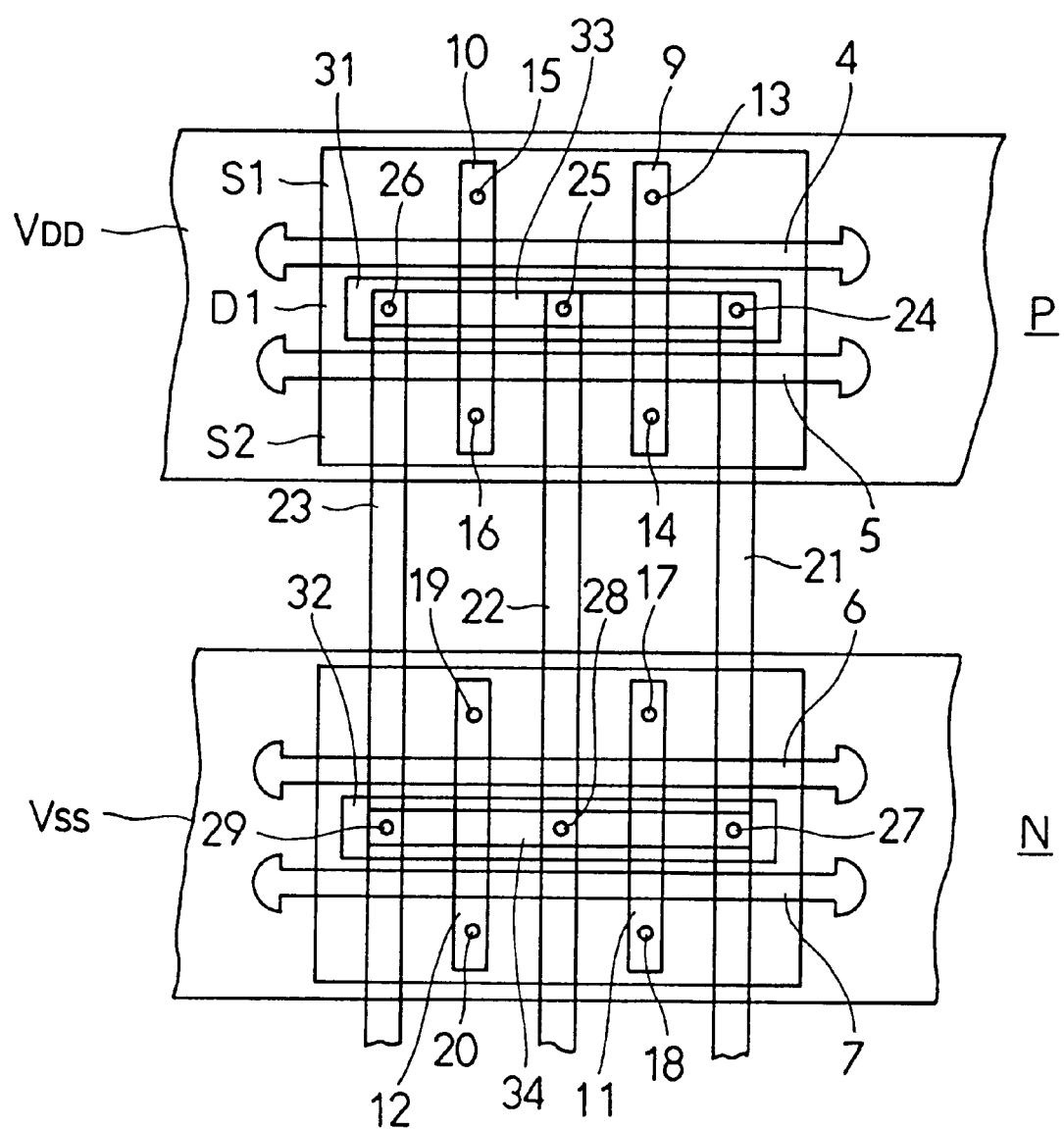
FIG. 1 is a plan view illustrating the wiring structure of a semiconductor integrated circuit device embodying the present invention.
Figure 2:
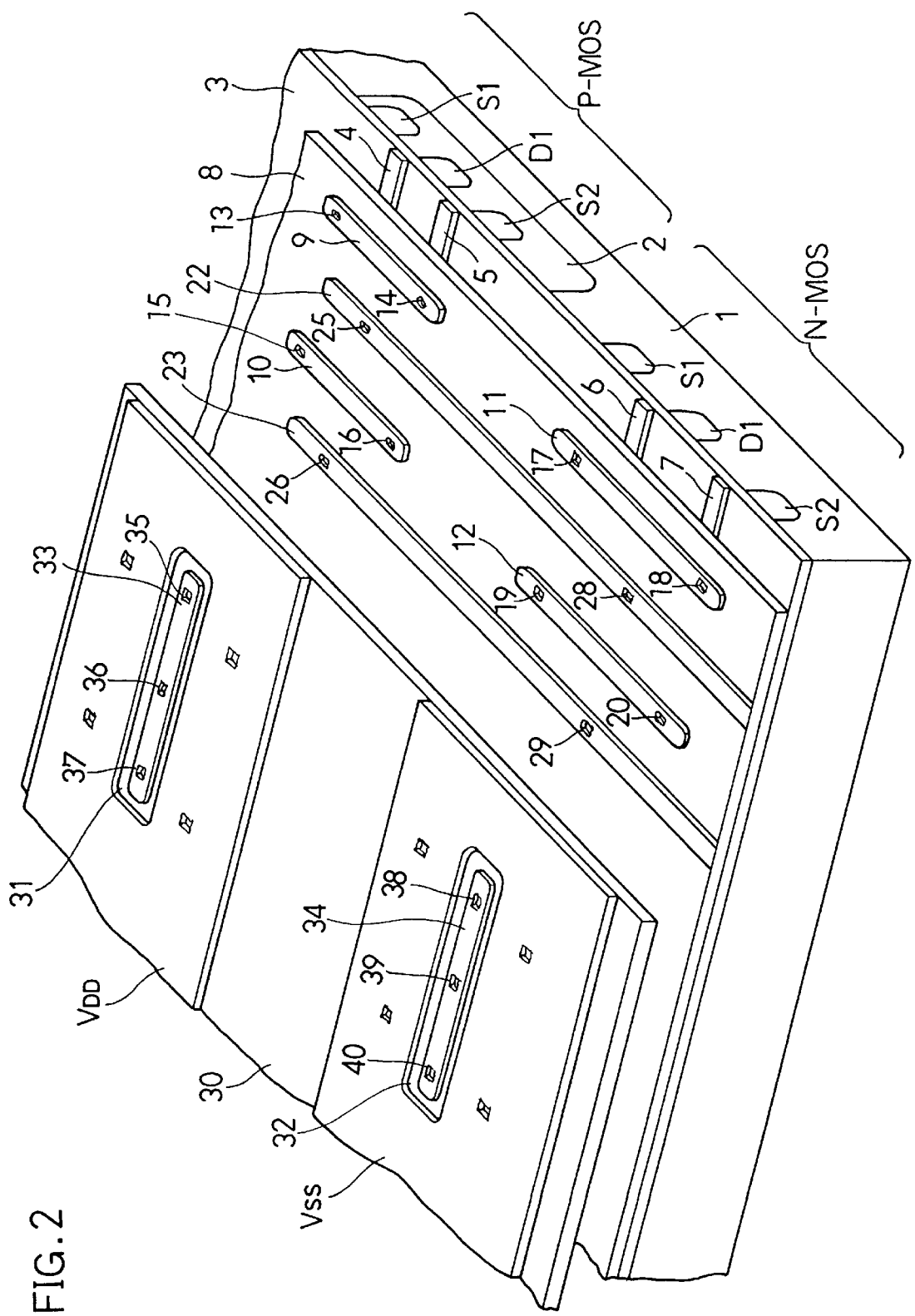
FIG. 2 is a partially exploded perspective view of a part of the semiconductor integrated circuit device embodying the present invention.
Figure 3:
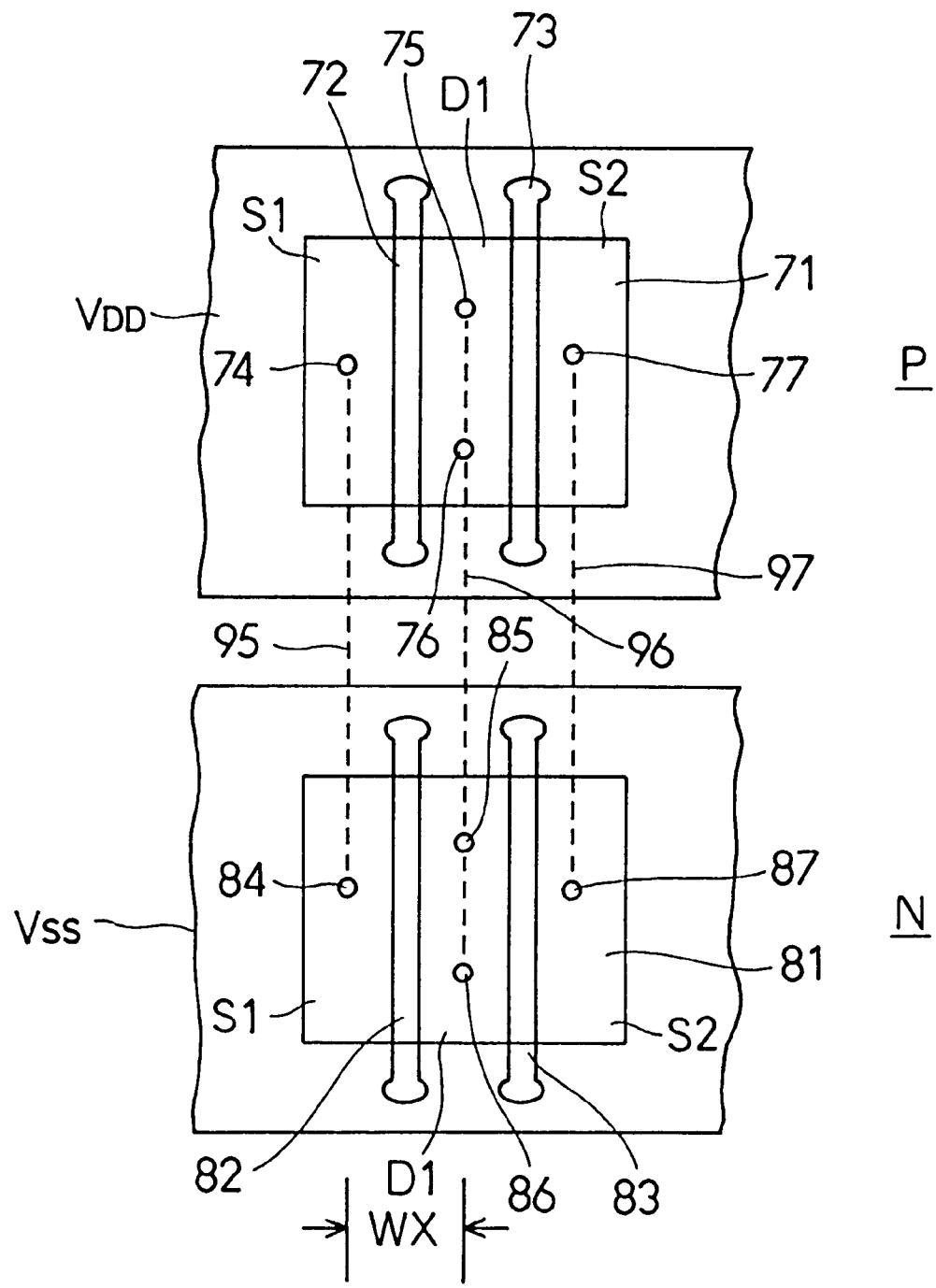
FIG. 3 is a plan view illustrating the wiring structure of a first conventional example of a semiconductor integrated circuit device.
Figure 4:
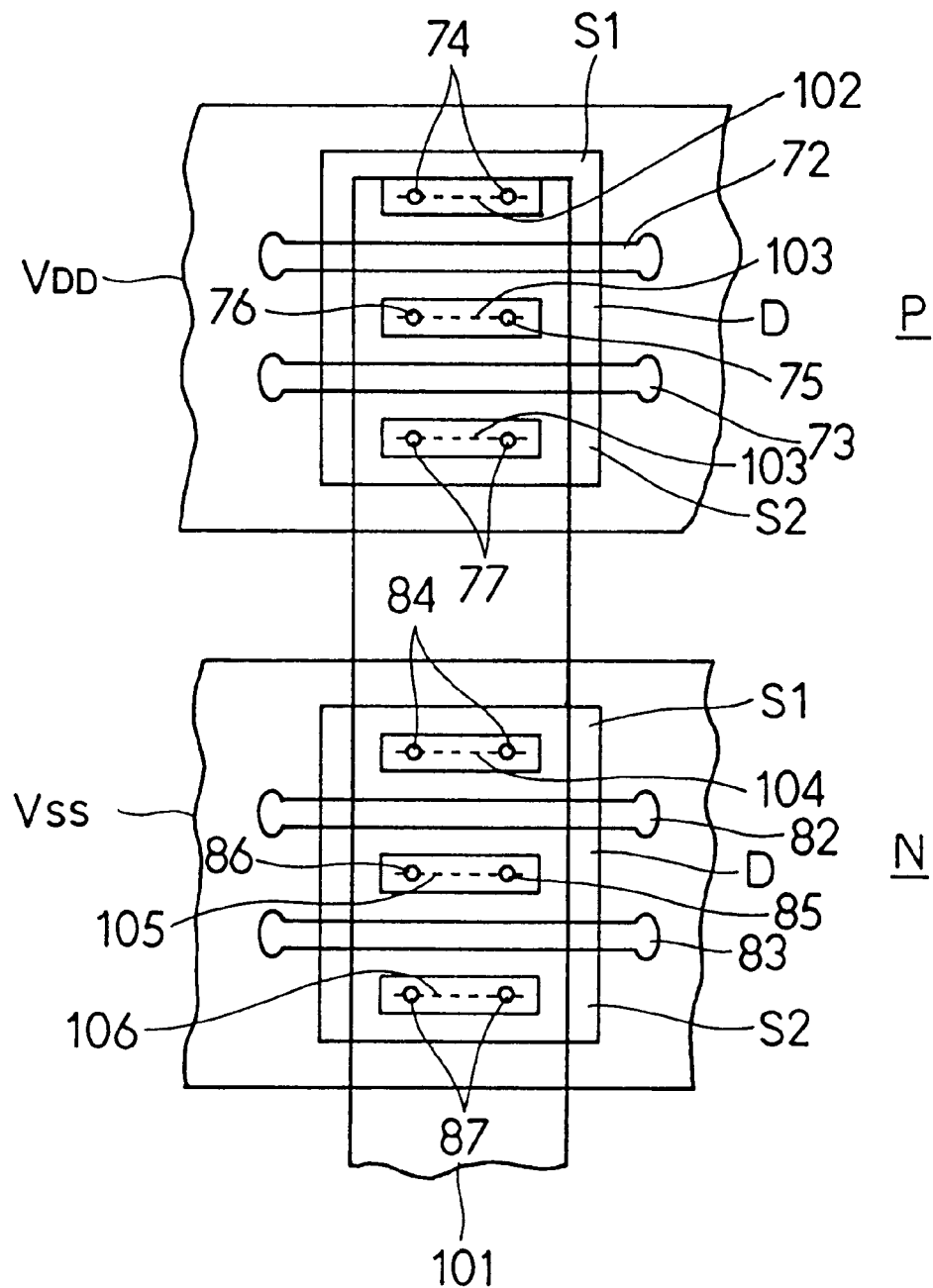
FIG. 4 is a plan view illustrating the wiring structure of a second conventional example of a semiconductor integrated circuit device.
Figure 5:
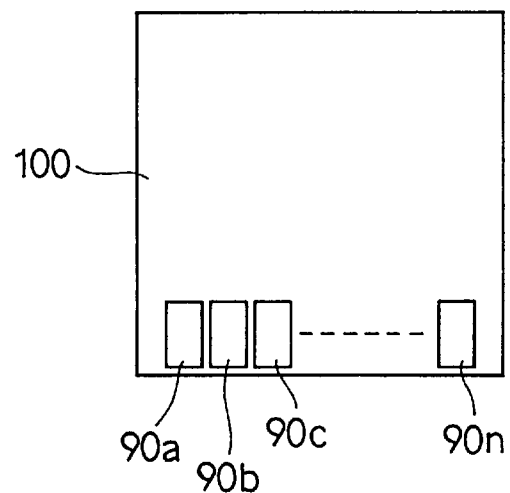
FIG. 5 is a diagram illustrating the I/O cells of a conventional semiconductor integrated circuit device.
Figure 6A:
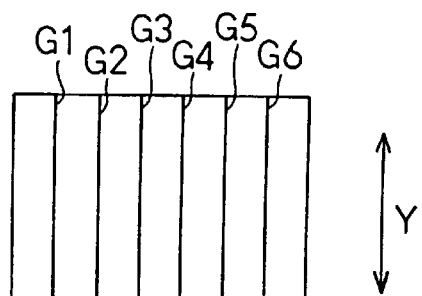
FIGS. 6A and 6B are diagrams illustrating how the driving capacity of a conventional semiconductor integrated circuit device is increased.
Figure 6B:
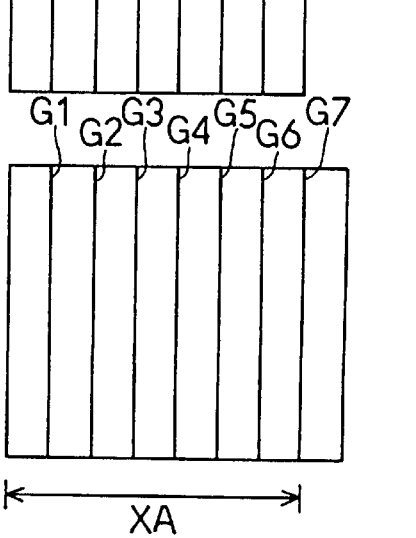
Figure 7:
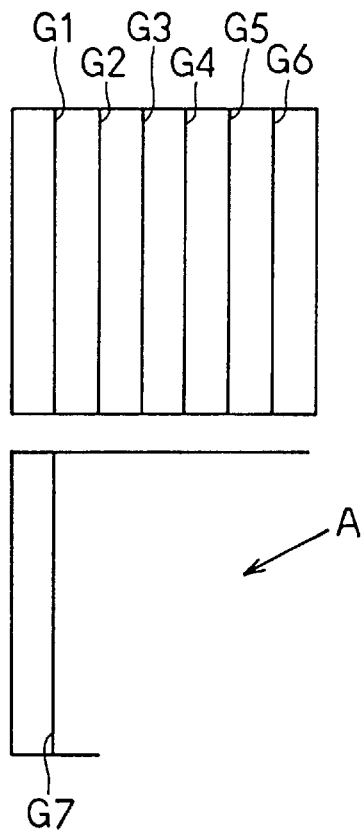
FIG. 7 is a diagram illustrating the disadvantage of the first conventional example.

FIG. 1 is a plan view of the wiring in the principal portion of a semiconductor integrated circuit device embodying the present invention. FIG. 2 is an exploded view schematically illustrating the principal portion of the same semiconductor integrated circuit device. In these figures, numeral 1 represents a P-type semiconductor substrate, and numeral 2 represents an N well formed therein. Within this N well, regions that serve as the sources S1 and S2 and the drain D1 of a P-MOS transistor are formed.

In a different portion of the semiconductor substrate 1, regions that serve as the sources S1 and S2 and the drain D1 of an N-MOS transistor are formed. Numeral 3 represents a first insulating film, made of a material such as $SiO_2$, on which gate electrodes 4 to 7 are formed as shown in the figures. Numeral 8 represents a second insulating film.

On the second insulating film 8 are formed wiring patterns 9 to 12 that connect together the sources S1 and S2 in each of the P-MOS and N-MOS transistors. These wiring patterns are connected to the sources S1 and S2 by way of contact holes 13 to 20 (see FIG. 1) formed through the first and second insulating films 3 and 8.

On the second insulating film 8 are also formed wiring patterns 21, 22, and 23 that connect together the drains D1 and D1 of the P-MOS and N-MOS transistors (though the wiring pattern 21 is omitted in FIG. 2). These wiring patterns 21, 22, and 23 are linear and parallel to one another, and are connected to the drains D1 and D1 through contact holes 24 to 29 (see FIG. 1) formed through the first and second insulating films 3 and 8.

Numeral 30 represents a third insulating film, on which are formed a power source line $V_{DD}$ and a ground line $V_{SS}$. The power source line $V_{DD}$ and the ground line $V_{SS}$ have a part thereof isolated by grooves 31 and 32 to form isolated wiring regions 33 and 34, respectively. The isolated wiring regions 33 and 34 are connected to the wiring patterns 21 to 23 formed on the insulating film 8 by way of via holes (35 to 40) formed through the third insulating film 30. Thus, the wiring patterns 9 to 12 and 21 to 23 are formed in a first wiring layer, and the power source line $V_{DD}$, the ground line $V_{SS}$, and the isolated wiring regions 33 and 34 are formed in a second wiring layer.

Figure 8A:
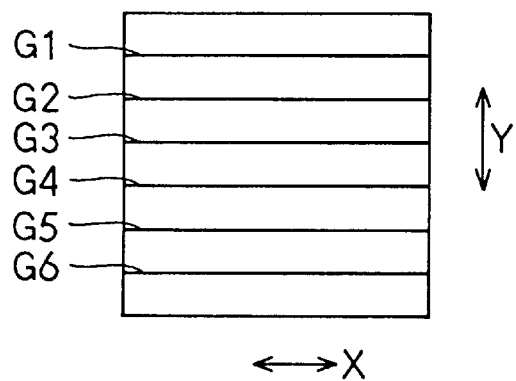
FIGS. 8A and 8B are diagrams illustrating how the driving capacity of the semiconductor integrated circuit device of the present invention is increased.
Figure 8B:
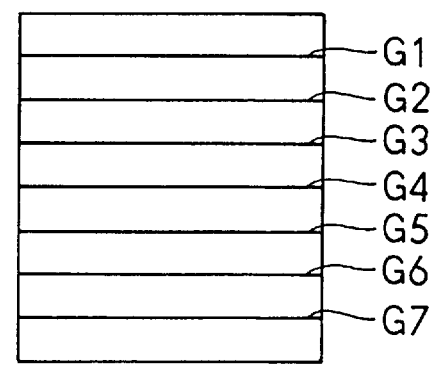
Figure 9:
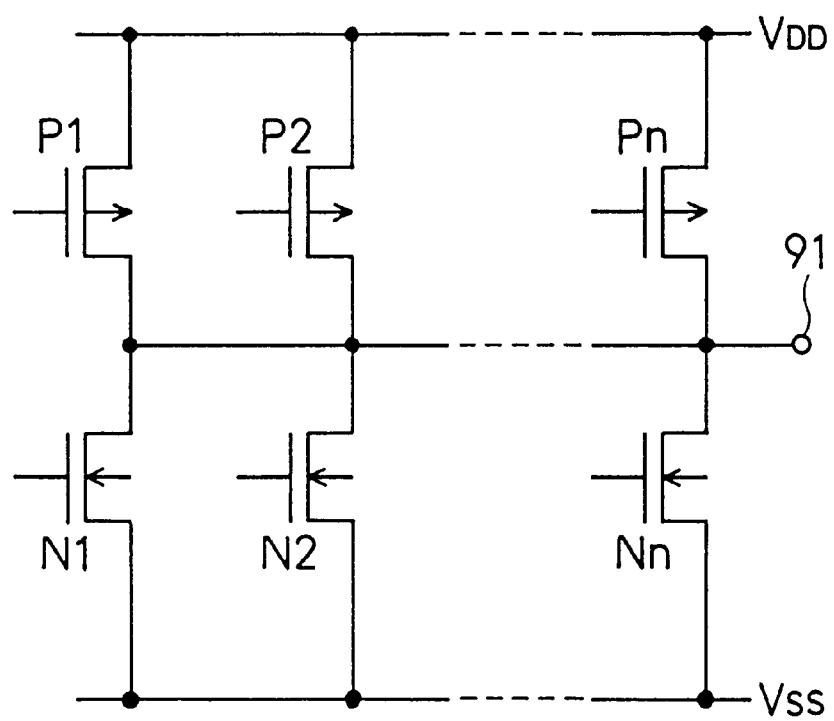
FIG. 9 is a circuit diagram common to a conventional semiconductor integrated circuit device and to the semiconductor integrated circuit device of the present invention.

As described above, in this embodiment, a part of the power source line $V_{DD}$ and a part of the ground line $V_{SS}$, both formed in the second wiring layer, are used as isolated wiring regions, and these are connected to the wiring patterns that are formed in the first wiring layer (i.e. the wiring patterns 21 to 23 mentioned above). This makes it possible to connect the P-MOS and N-MOS transistors in a desired manner without forming a third wiring layer. In addition, in this embodiment, it is possible to increase the driving capacity simply by adding, as shown in FIGS. 8A and 8B, one or more transistors in the direction (indicated as "Y") in which the transistors are arranged and thus without unduly increasing the circuit area.

Since the wiring patterns 21 to 23 run along the channel length and parallel to one another, they can be made considerably wide without occupying unduly large wiring space (i.e. without reducing the freedom in the layout of other wiring patterns in the first wiring layer). This, together with the fact that a plurality of such wiring patterns are formed, helps secure a large current capacity. Of course, it is also possible to form the wiring patterns 21 to 23 perpendicularly to the channel length (i.e. along the channel width, namely in the direction in which the gate electrodes are arranged). This, however, requires the wiring patterns 21 to 23 to be formed in a shape like the letter "U" to skirt around the wiring patterns 9 to 12, and thus reduces the space that may be used to widen wiring patterns.

In the structure described above, by additionally forming another power source line and another ground line in a third wiring layer, it is possible to substantially double the widths of the power source line and the ground line (i.e. the widths of the power source line and the ground line in the third wiring layer are added to the widths of those in the second wiring layer).

As described heretofore, according to the present invention, it is possible to adjust the driving capacity stepwise according to the number of transistors arranged each having a width WX. Moreover, this can be achieved by two-layer wiring. Two-layer wiring, compared with conventional three-layer wiring, requires less cost, and in addition helps reduce the time required for the development and manufacture of semiconductor integrated circuit devices.

What is claimed is:

1. A semiconductor integrated circuit device in which a group of transistors of a first conduction type and a group of transistors of a second conduction type are formed on a semiconductor substrate, said transistors being arranged with their channel length all aligned in a first direction within a semiconductor chip, said transistors being connected in a predetermined manner with wiring patterns all aligned in only a second direction on said semiconductor substrate, wherein a power source line and a ground line both aligned only in the first direction, each formed as a wiring pattern in a second wiring layer, each have a groove formed therein extending in said first direction, an isolated wiring region is formed with said groove and connected, by way of a via hole, to said wiring patterns that are formed in a first wiring layer to connect between said group of transistors of the first conduction type and said group of transistors of the second conduction type.

2. A semiconductor integrated circuit device as claimed in claim 1 that functions as an input/output device.

3. A semiconductor integrated circuit device comprising:

a plurality of P-MOS transistors formed in a semiconductor substrate;

a plurality of N-MOS transistors formed in said semiconductor substrate;

a first insulating film laid on said semiconductor substrate;

a plurality of gate electrodes, one for each of said transistors, that are arranged in a first direction on said first insulating film;

a second insulating film laid on said first insulating film on which said gate electrodes are arranged;

first wiring patterns laid on said second insulating film for connecting together sources of said plurality of P-MOS transistors;

second wiring patterns laid on said second insulating film for connecting together sources of said plurality of N-MOS transistors;

third wiring patterns laid linearly and parallel to one another on said second insulating film for connecting drains of said P-MOS transistors to drains of said N-MOS transistors;

a third insulating film formed on said second insulating film on which said first, second, and third wiring patterns are laid;

a power source line formed on said third insulating film over said P-MOS transistors;

a ground line formed on said third insulating film over said N-MOS transistors;

a first isolated wiring pattern formed within said power source line;

a second isolated wiring pattern formed within said ground line; and means for connecting said first and second isolated wiring patterns to said third wiring patterns by way of a via hole formed in said third insulating film.

4. A semiconductor integrated circuit device as claimed in claim 3 that functions as an input/output device.

* * * * *